(12) United States Patent
Chi

(10) Patent No.: US 11,610,902 B1
(45) Date of Patent: Mar. 21, 2023

(54) ANTIFUSE ARRAY STRUCTURE AND MEMORY

(71) Applicant: CHANGXIN MEMORY TECHNOLOGIES, INC., Hefei (CN)

(72) Inventor: Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/813,098

(22) Filed: Jul. 18, 2022

Related U.S. Application Data

(63) Continuation of application No. PCT/CN2022/097199, filed on Jun. 6, 2022.

(30) Foreign Application Priority Data

Sep. 17, 2021 (CN) .......................... 202111095281.X

(51) Int. Cl.
*H01L 27/112* (2006.01)
*H01L 23/525* (2006.01)

(52) U.S. Cl.
CPC .... *H01L 27/11206* (2013.01); *H01L 23/5252* (2013.01)

(58) Field of Classification Search
CPC ................... H01L 27/11206; H01L 23/5252
See application file for complete search history.

(56) References Cited

U.S. PATENT DOCUMENTS 6,185,122 B1    2/2001  Johnson et al.
9,196,377 B1 *  11/2015 Park .................. G11C 13/0004

FOREIGN PATENT DOCUMENTS

| CN | 1339159 A    | 3/2002 |
| CN | 101488502 A  | 7/2009 |
| CN | 106783858 A  | 5/2017 |
| WO | 03034331 A1  | 4/2003 |

OTHER PUBLICATIONS

International Search Report cited in PCT/CN2022/097199 dated Jul. 27, 2022, 15 pages.

* cited by examiner

*Primary Examiner* — Allison Bernstein
(74) *Attorney, Agent, or Firm* — Cooper Legal Group, LLC

(57) ABSTRACT

The present disclosure provides an antifuse array structure and a memory. The antifuse array structure includes a plurality of antifuse integrated structures arranged in a bit line extension direction and a word line extension direction to form an antifuse matrix. The antifuse integrated structure is arranged in a same active region, and an extension direction of the active region is the same as the bit line extension direction. Each antifuse integrated structure includes a first antifuse memory MOS transistor, a first switch transistor, a second switch transistor, and a second antifuse memory MOS transistor. The first switch transistor and the second switch transistor are respectively controlled through two adjacent word lines, the first antifuse memory MOS transistor and the second antifuse memory MOS transistor are respectively controlled through two adjacent programming wires, and the programming wire is further configured to control adjacent antifuse integrated structures.

15 Claims, 10 Drawing Sheets

US 11,610,902 B1

ANTIFUSE ARRAY STRUCTURE AND MEMORY

CROSS-REFERENCE TO RELATED APPLICATIONS

This is a continuation of International Application No. PCT/CN2022/097199, filed on Jun. 6, 2022, which is based on and claims the priority to Chinese Patent Application 202111095281.X, titled "ANTIFUSE ARRAY STRUCTURE AND MEMORY" and filed on Sep. 17, 2021. The entire contents of International Application No. PCT/CN2022/097199 and Chinese Patent Application 202111095281.X are herein incorporated into the present disclosure for reference.

TECHNICAL FIELD

The present disclosure relates to, but is not limited to, an antifuse array structure and a memory.

BACKGROUND

Semiconductor devices are essential for many modern applications. In the semiconductor devices, memory devices for storing data play an important role. With the advancement of technology, the capacity of the memory devices continues to increase. In other words, the density of memory arrays arranged on a substrate increases.

For an antifuse memory, the density of the memory arrays increases, and the interval between every two adjacent antifuse memory cells decreases, so it is difficult to ensure the electrical isolation effect of electrical components between the every two adjacent antifuse memory cells.

Therefore, there is an urgent need to improve the layout of an antifuse array structure to ensure the electrical isolation effect of the electrical components between the every two adjacent antifuse memory cells.

SUMMARY

An overview of the subject matter detailed in the present disclosure is provided below, which is not intended to limit the protection scope of the claims.

The present disclosure provides an antifuse array structure and a memory.

A first aspect of the present disclosure provides an antifuse array structure, including: a plurality of antifuse integrated structures, arranged in a bit line extension direction and a word line extension direction to form an antifuse matrix, the bit line extension direction being perpendicular to the word line extension direction; wherein the antifuse integrated structure is arranged in a same active region, and an extension direction of the active region is the same as the bit line extension direction; and each of the antifuse integrated structures includes: a first antifuse memory MOS transistor, a first switch transistor, a second switch transistor, and a second antifuse memory MOS transistor sequentially arranged in the bit line extension direction, wherein the first switch transistor and the second switch transistor are respectively controlled through two adjacent word lines, a common terminal of the first switch transistor and the second switch transistor is connected to a bit line, the first antifuse memory MOS transistor and the second antifuse memory MOS transistor are respectively controlled through two adjacent programming wires, and the programming wire is further configured to control adjacent antifuse integrated structures in the bit line extension direction.

A second aspect of the present disclosure provides a memory, including a memory array employing the antifuse array structure according to any implementation of the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

For an antifuse memory, the density of memory arrays increases, and the interval between every two adjacent antifuse memory cells decreases, so it is difficult to ensure the electrical isolation effect of electrical components between the every two adjacent antifuse memory cells.

One embodiment of the present disclosure provides an antifuse array structure, and provides a new layout of antifuse array, such that a memory array with the same capacity only requires to occupy a smaller layout area, thereby increasing the interval between every two adjacent antifuse memory cells based on the original layout area, and ensuring the electrical isolation effect of electrical components between the every two adjacent antifuse memory cells.

Figure 1:
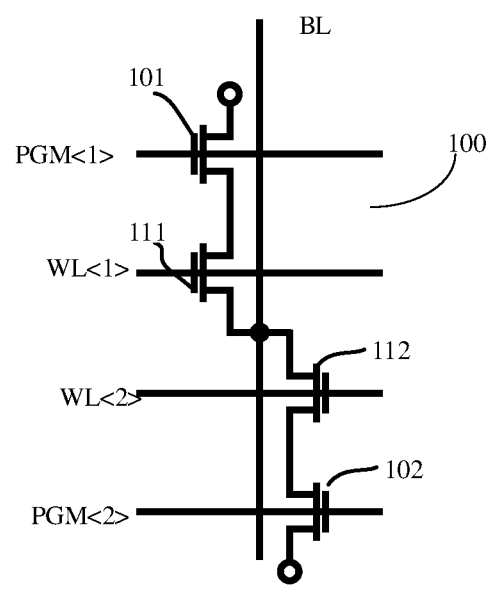
FIG. 1 is a schematic diagram of a circuit of an antifuse integrated structure according to one embodiment of the present disclosure.
Figure 2:
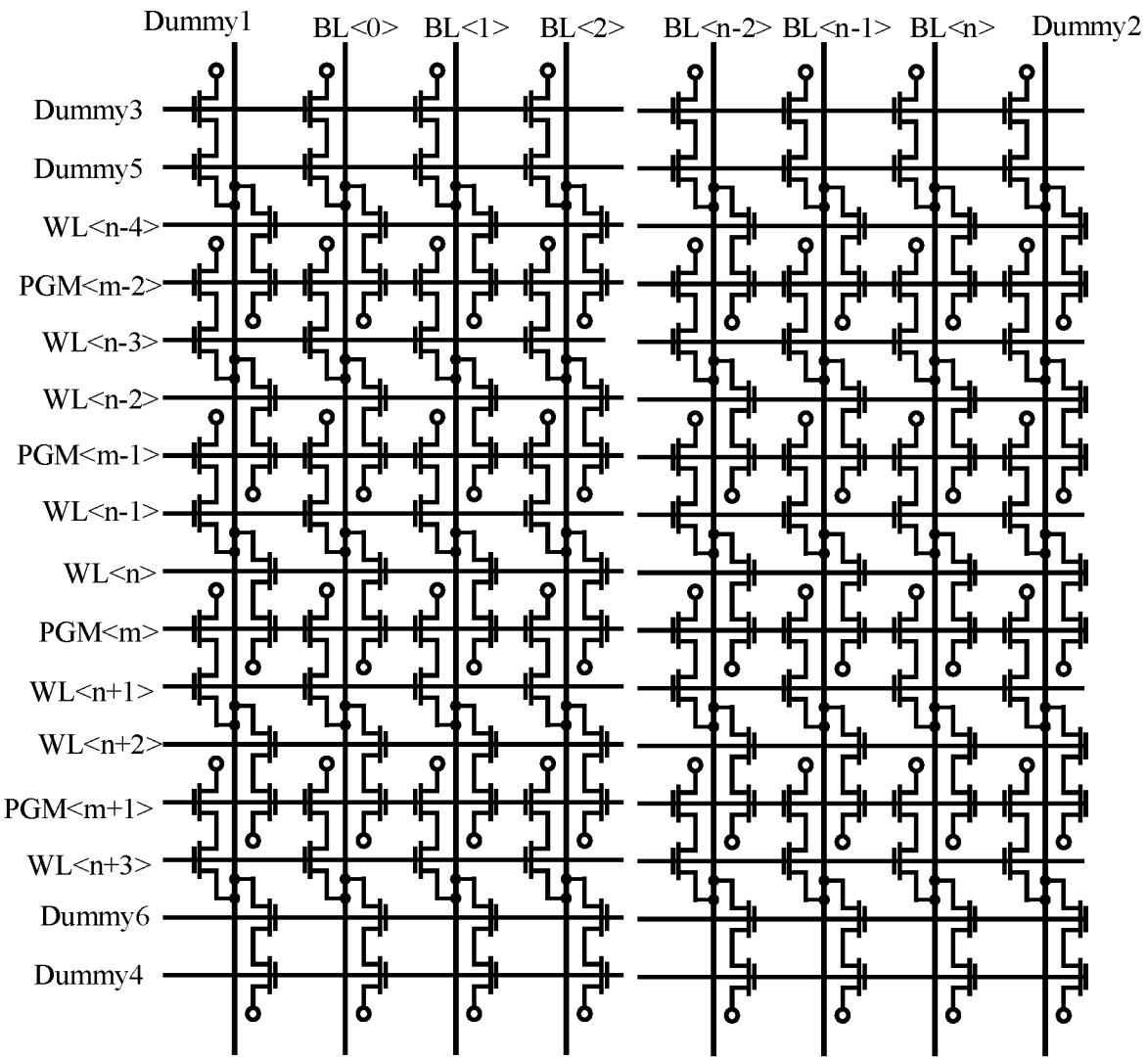
FIG. 2 is a schematic diagram of a circuit of an antifuse matrix according to one embodiment of the present disclosure.
Figure 3:
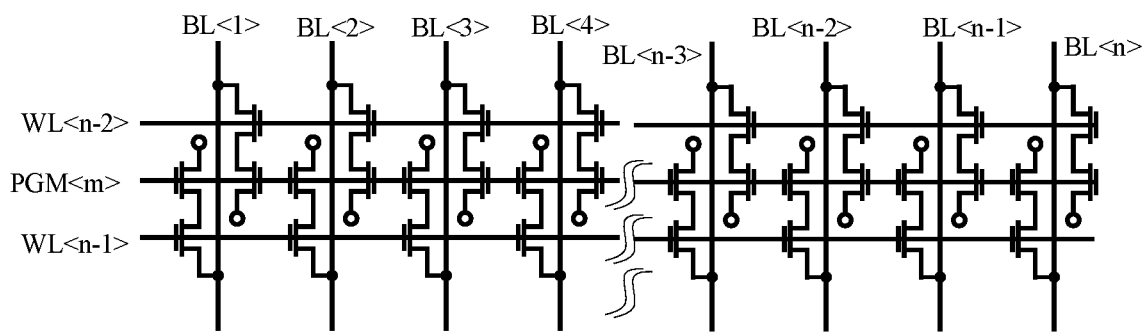
FIG. 3 is a principle diagram where antifuse memory cells in adjacent antifuse integrated structures are connected to the same programming wire according to one embodiment of the present disclosure.
Figure 4:
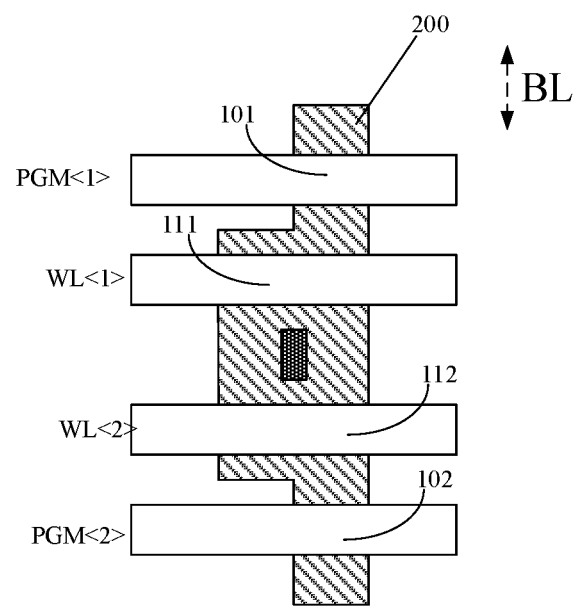
FIG. 4 and FIG. 5 are schematic top views of a layout structure of an antifuse integrated structure according to one embodiment of the present disclosure.
Figure 5:
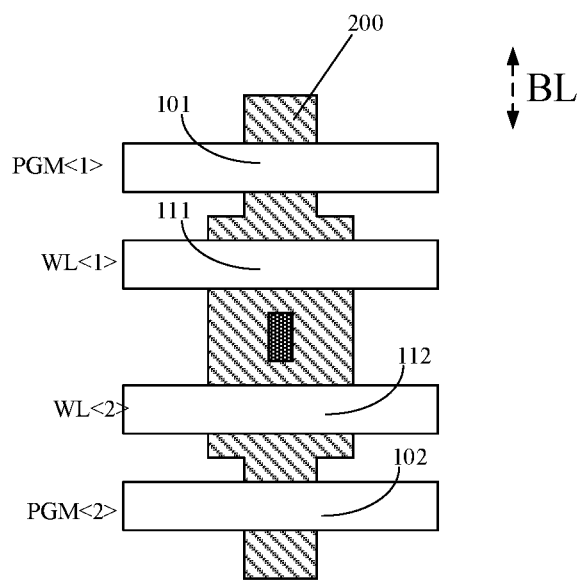
Figure 6:
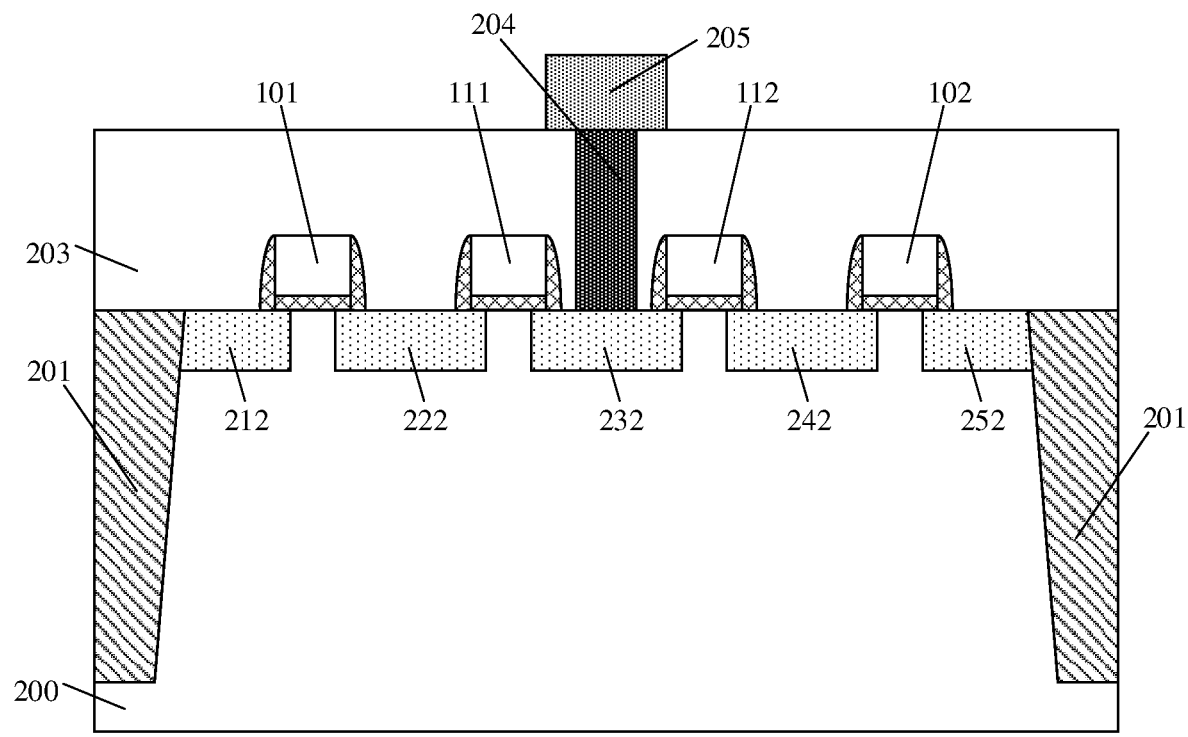
FIG. 6 is a schematic cross-sectional diagram of a layout structure of an antifuse integrated structure according to one embodiment of the present disclosure.
Figure 7:
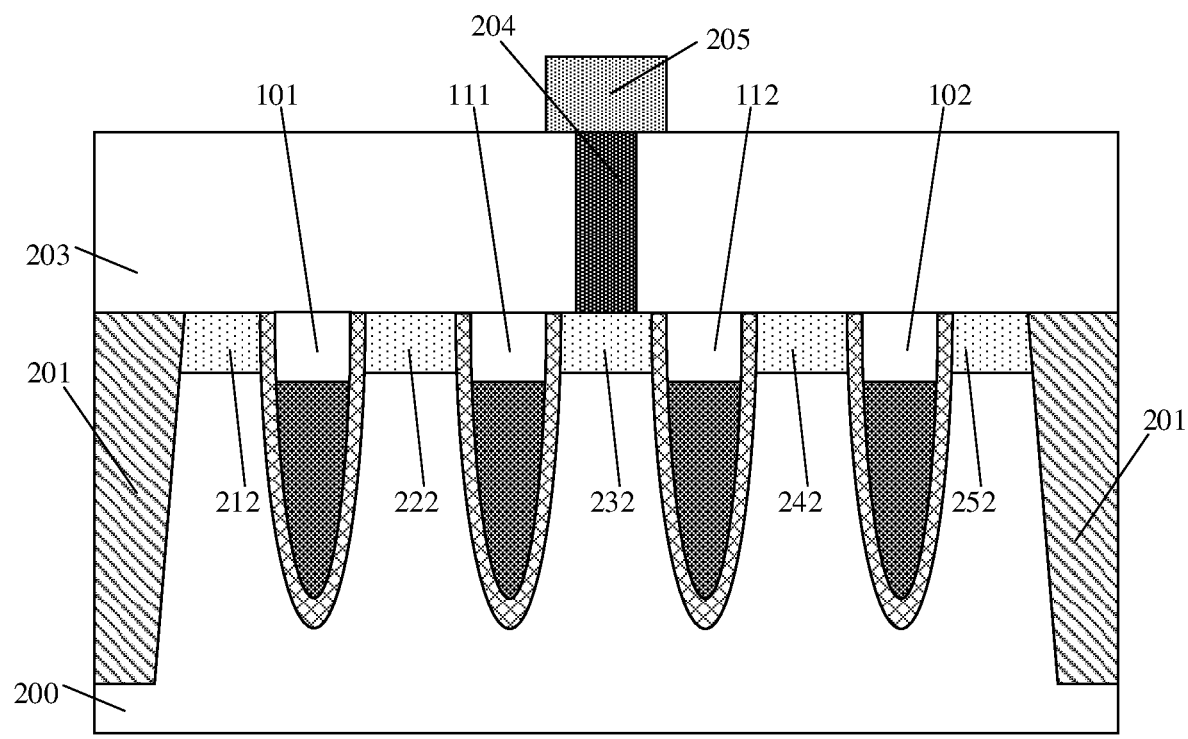
FIG. 7 is a schematic cross-sectional diagram of a layout structure of another antifuse integrated structure according to one embodiment of the present disclosure.
Figure 8:
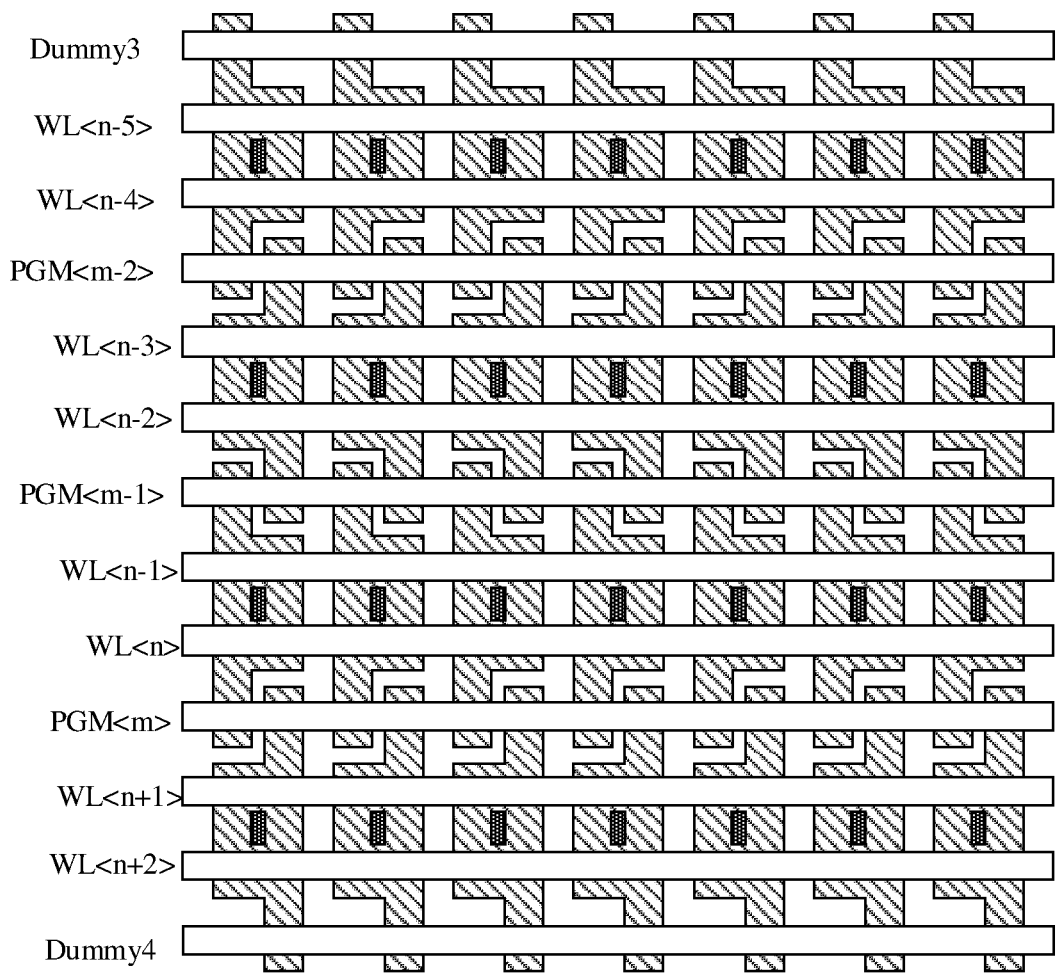
FIG. 8 and FIG. 9 are schematic diagrams of a layout structure of an antifuse matrix according to one embodiment of the present disclosure.
Figure 9:
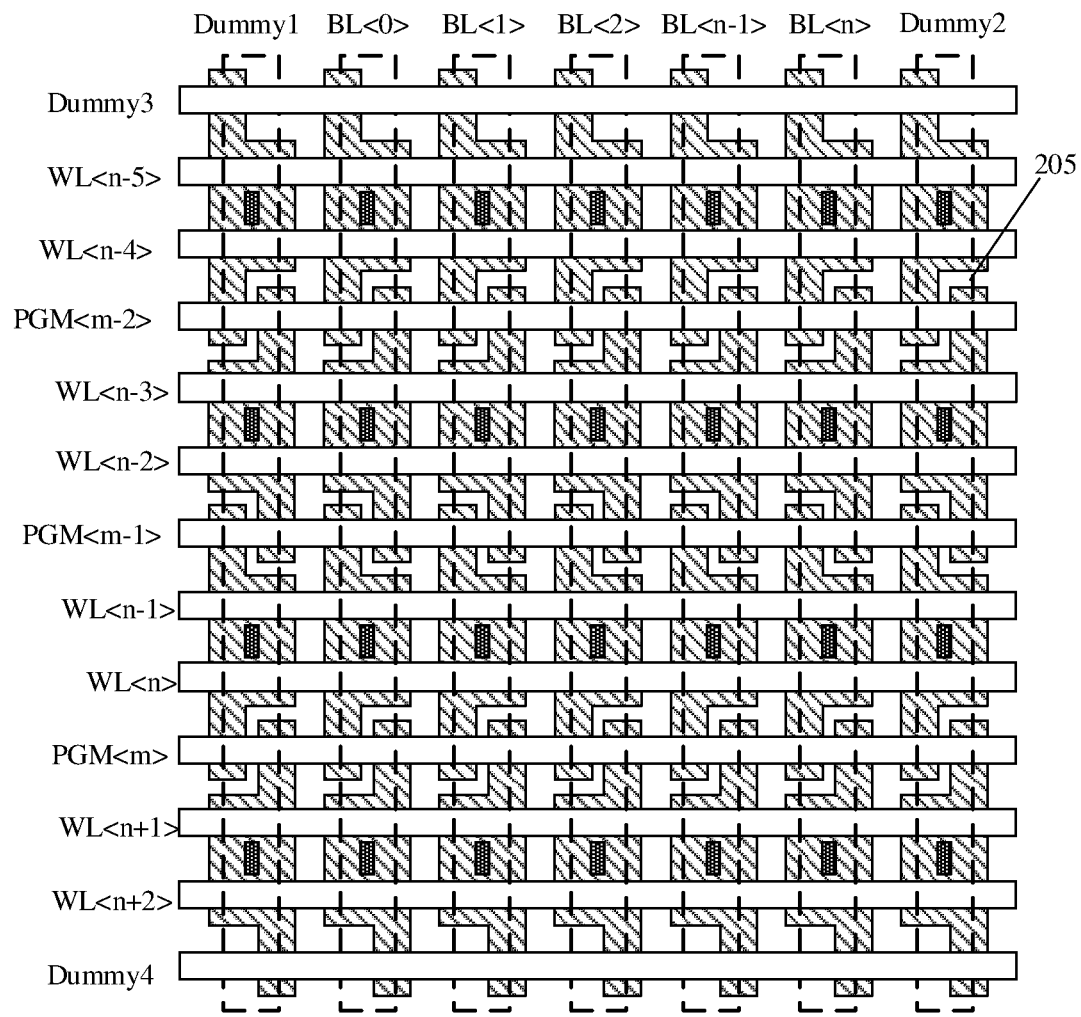
Figure 10:
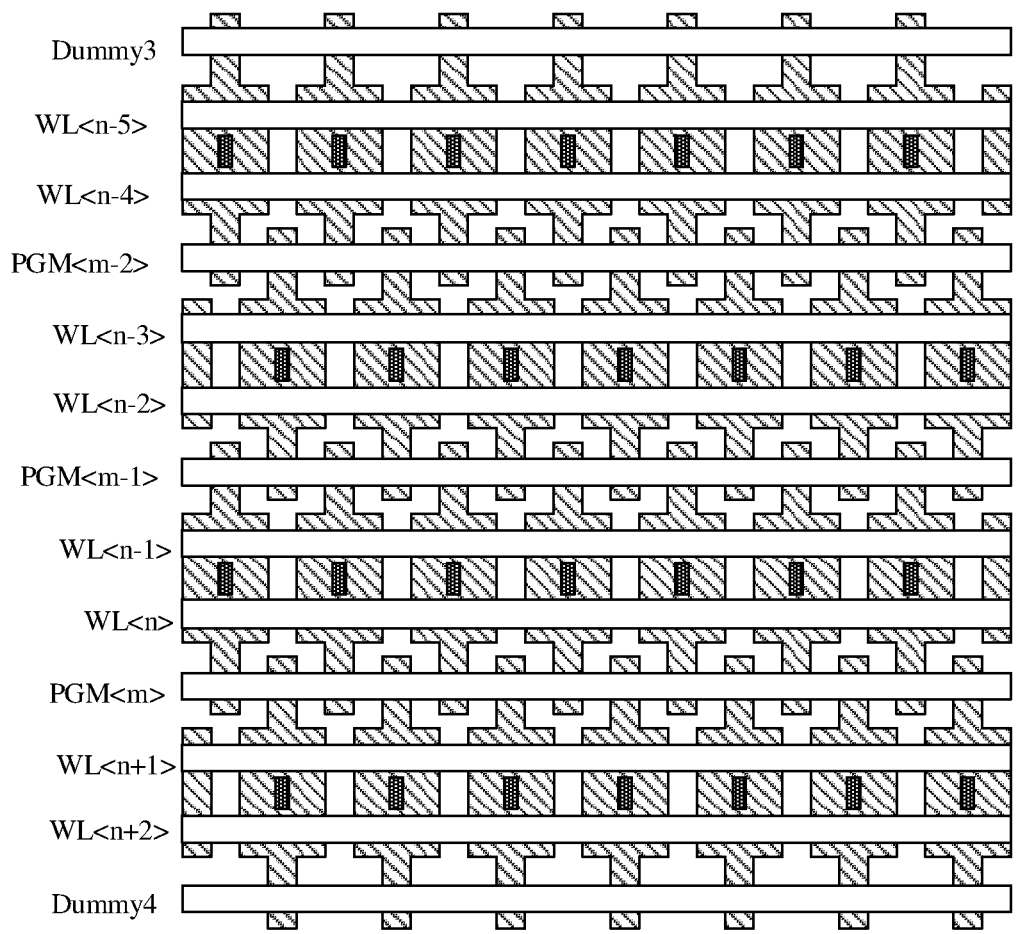
FIG. 10 and FIG. 11 are schematic diagrams of a layout structure of a bit line in an antifuse matrix according to one embodiment of the present disclosure.
Figure 11:
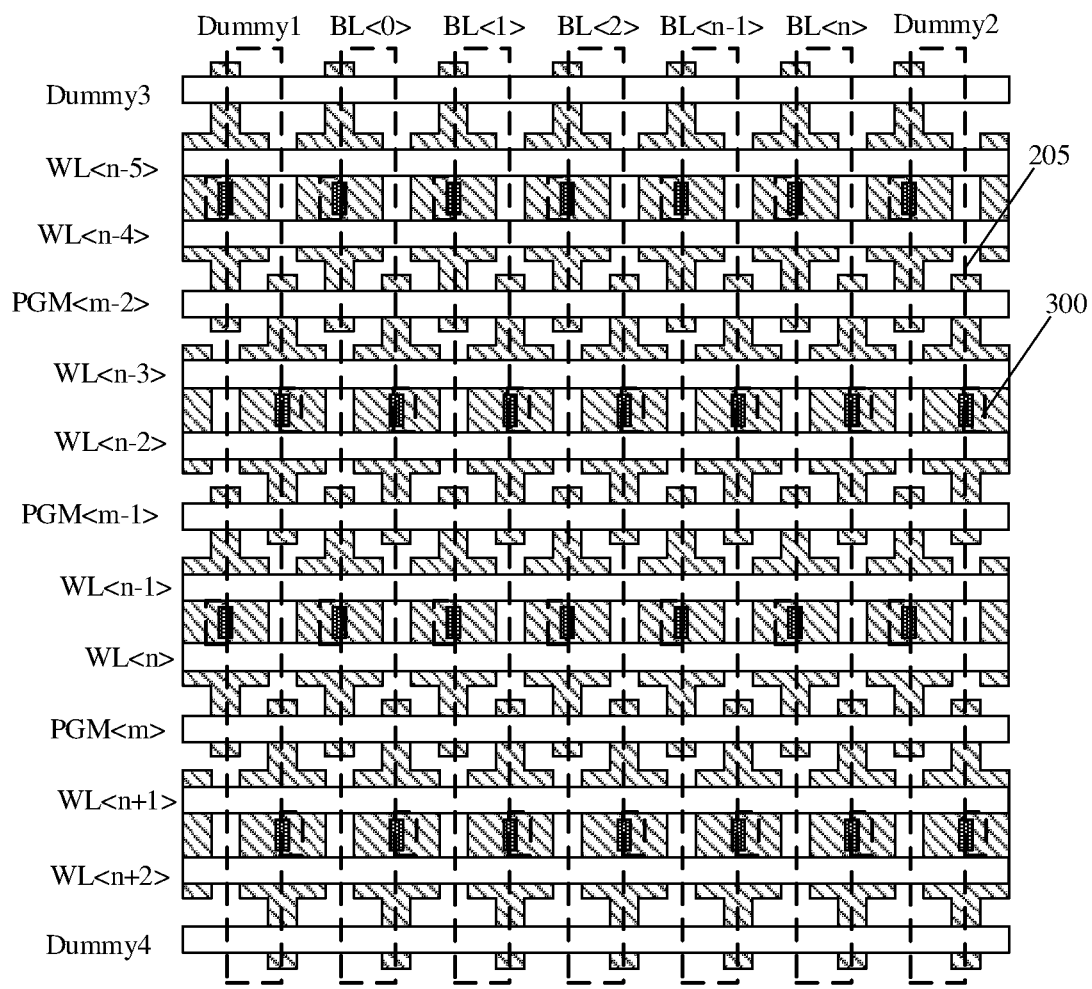

FIG. 1 is a schematic diagram of a circuit of an antifuse integrated structure according to this embodiment; FIG. 2 is a schematic diagram of a circuit of an antifuse matrix according to this embodiment; FIG. 3 is a principle diagram where antifuse memory cells in adjacent antifuse integrated structures are connected to the same programming wire according to this embodiment; FIG. 4 and FIG. 5 are schematic top views of a layout structure of an antifuse integrated structure according to this embodiment; FIG. 6 is a schematic cross-sectional diagram of a layout structure of an antifuse integrated structure according to this embodiment; FIG. 7 is a schematic cross-sectional diagram of a layout structure of another antifuse integrated structure according to this embodiment; FIG. 8 and FIG. 9 are schematic diagrams of a layout structure of an antifuse matrix according to this embodiment; and FIG. 10 and FIG. 11 are schematic diagrams of a layout structure of a bit line in an antifuse matrix according to this embodiment. The antifuse array structure provided by this embodiment is described in further detail below with reference to the accompanying drawings.

Referring to FIG. 1 and FIG. 2, an antifuse array structure includes:

a plurality of antifuse integrated structures 100 (referring to FIG. 1) arranged in a bit line (BL) extension direction and a word line (WL) extension direction to form an antifuse matrix (referring to FIG. 2), where the BL extension direction is perpendicular to the WL extension direction.

Each antifuse integrated structure 100 includes: a first antifuse memory MOS transistor 101, a first switch transistor 111, a second switch transistor 112, and a second antifuse memory MOS transistor 102 sequentially arranged in the BL extension direction. The first switch transistor 111 and the second switch transistor 112 are respectively controlled through two adjacent WLs, a common terminal of the first switch transistor 111 and the second switch transistor 112 is connected to a BL, the first antifuse memory MOS transistor 101 and the second antifuse memory MOS transistor 102 are respectively controlled through a programming wire PWM, and the programming wire PWM is further configured to control the adjacent antifuse integrated structures 100 in the BL extension direction.

In addition, the antifuse integrated structure 100 is arranged in a same active region, and an extension direction of the active region is the same as the BL extension direction.

It should be noted that FIG. 2 is a schematic diagram of only a part of the formed antifuse matrix, which is only configured to reflect the arrangement of the antifuse matrix in the embodiment of the present disclosure, and does not constitute a limitation to the number of BLs, WLs, and programming wires PGM. In specific use, the number of corresponding BLs, WLs, and programming wires PGM can be selected according to the required capacity of the memory array. In addition, the numerical values in "< >" are only configured to distinguish different BLs, WLs, or programming wires PGM, and do not constitute a limitation to this embodiment.

As shown in FIG. 1, each antifuse integrated structure 100 includes a first antifuse memory MOS transistor 101, a first switch transistor 111, a second switch transistor 112, and a second antifuse memory MOS transistor 102. That is, each antifuse integrated structure 100 includes two antifuse memory cells and two switch units. The first antifuse memory MOS transistor 101 and the second antifuse memory MOS transistor 102 are respectively controlled through adjacent programming wires PWM, that is, the two antifuse memory cells are controlled through the adjacent programming wires. The first switch transistor 111 and the second switch transistor 112 are used as switch transistors of the antifuse memory cells, and are controlled through the adjacent WLs. In the antifuse array, the extension direction of the programming wires PWM is the same as the WL extension direction, that is, the extension direction of the programming wires PWM is perpendicular to the BL extension direction. In the BL extension direction, the programming wire PWM is further configured to control two adjacent antifuse integrated structures 100 arranged in the BL extension direction, and the same programming wire PWM is configured to control one antifuse memory cell in two adjacent antifuse integrated structures 100 connected to the same BL, that is, the same programming wire PWM is configured to control two antifuse memory cells located in different antifuse integrated structures 100, thereby reducing the layout length of the antifuse memory array in the BL extension direction. On the basis of the original layout area and the layout of a memory array with the same capacity, the interval between a switch unit and an antifuse memory cell located in the same active region increases to ensure the electrical isolation effect of electrical components in the antifuse memory array.

As shown in FIG. 1, the gate of the first antifuse memory MOS transistor 101 is connected to a first programming wire PGM<1>; the first switch transistor 111 is provided with a gate connected to a first word line WL<1>, one of a source or a drain connected to the first antifuse memory MOS transistor 101, and the other one of the source or the drain connected to the BL; the second switch transistor 112 is provided with a gate connected to a second word line WL<2>, one of a source or a drain connected to the second antifuse memory MOS transistor 102, and the other one of the source or the drain connected to the BL; and the gate of the second antifuse memory MOS transistor 102 is connected to a second programming wire PGM<2>.

In some exemplary embodiments, referring to FIG. 3, for any two adjacent antifuse integrated structures 100 in the BL extension direction, the gate of the second switch transistor 112 of one antifuse integrated structure 100 is connected to a word line Wl<n−2>, and the gate of the second antifuse memory MOS transistor 102 is connected to a programming wire PGM<m>; and the gate of the first antifuse memory MOS transistor 101 of the other antifuse integrated structure 100 is connected to the programming wire PGM<m>, and the gate of the first switch transistor 111 is connected to a word line Wl<n−1>. In the BL extension direction, the first switch transistor 111 and the second switch transistor 112 in each of any two adjacent antifuse integrated structures 100 are both connected to a bit line BL<n>. That is, in the BL extension direction, the gate of the second antifuse memory MOS transistor 102 of each antifuse integrated structure 100 and the gate of the first antifuse memory MOS transistor 101 of the adjacent antifuse integrated structure 100 are connected to the same programming wire PGM<m>, where n and m are integers greater than or equal to 1.

It should be noted that in other examples, it can also be configured that in the BL extension direction, the gate of the first antifuse memory MOS transistor of each antifuse integrated structure and the gate of the second antifuse memory MOS transistor of the adjacent antifuse integrated structure are connected to the same programming wire.

Referring to FIG. 4 and FIG. 5, for the first antifuse memory MOS transistor 101, the first switch transistor 111, the second switch transistor 112, and the second antifuse memory MOS transistor 102 arranged in the same active region, in one example, the active region 200 includes an active region body, and a length direction of the active region body is the extension direction of the active region 200. A width of each part of the active region body is the same in the extension direction of the active region 200 to ensure that every two adjacent active devices in the antifuse matrix have a same interval, thereby effectively guaranteeing the electrical isolation effect of the active devices in the antifuse matrix.

In some embodiments, referring to FIG. 4, the active region further includes a bump arranged on at least one side of the active region body, for example, arranged on at least one side of the length direction of the active region. A length of the bump is smaller than a length of the active region body in the extension direction of the active region 200, and a width of the middle of the active region 200 is larger than a width of both ends of the active region 200 in the WL extension direction. The bump and the active region body are configured to form the first switch transistor 111 and the second switch transistor 112, and a channel region width of the first switch transistor 111 and the second switch transistor 112 is a width sum of the bump and the active region body. The first antifuse memory MOS transistor 101 and the second antifuse memory MOS transistor 102 are arranged in the active region body, and a channel region width of the first antifuse memory MOS transistor 101 and the second antifuse memory MOS transistor 102 is a width of the active region. The arrangement of the bump increases a width-length ratio of the active region where the first switch transistor 111 and the second switch transistor 112 are located, thereby improving the conductivity of the first switch transistor 111 and the second switch transistor 112, ensuring the first antifuse memory MOS transistor 101 and the second antifuse memory MOS transistor 102 to allow an enough fusion voltage to flow, and avoiding data read/write errors of the antifuse memory cells caused by poor conductivity of the first switch transistor 111 and the second switch transistor 112. In addition, the increase in the width of the middle of the active region 200 facilitates the preparation of the first switch transistor 111 and the second switch transistor 112.

In one example, the active region only includes the active region body. In one example, referring to FIG. 4, the bump is arranged on one side of the active region body, and the bumps in two adjacent active regions are oppositely arranged in the BL extension direction. That is, for two adjacent rows of active regions 200, the bumps in one row of active regions 200 are located on one side of the active region body, and the bumps in the other row of active region 200 are located on the other side of the bump in the active region. Thus, two adjacent rows of active regions are closely arranged while the area of the active region can be increased, thereby reducing the area of the antifuse array structure.

In another example, referring to FIG. 5, the bumps are arranged on two opposite sides of the active region body, and are symmetrically arranged on the basis of the active region body.

In some embodiments, in the BL extension direction, orthographic projections of the active region bodies of two adjacent antifuse integrated structures 100 on a preset plane at least partially overlap, such that the area of the antifuse array structure can be further reduced. The preset plane is parallel to the BL extension direction and perpendicular to the WL extension direction.

In some embodiments, referring to FIG. 6 and FIG. 7, the active region 200 includes:

a first doped region 212, a second doped region 222, a third doped region 232, a fourth doped region 242, and a fifth doped region 252 sequentially arranged in the extension direction of the active region 200.

An isolation region 201 surrounds the active region 200. The first doped region 212 is an idle terminal of the first antifuse memory MOS transistor 101, the second doped region 222 is a common terminal of the first antifuse memory MOS transistor 101 and the first switch transistor 111, the third doped region 232 is a common terminal of the first switch transistor 111 and the second switch transistor 112, the fourth doped region 242 is a common terminal of the second switch transistor 112 and the second antifuse memory MOS transistor 102, and the fifth doped region 252 is an idle terminal of the second antifuse memory MOS transistor 102.

That is, the first antifuse memory MOS transistor 101 is provided with a source that is idle, and a drain connected to the drain of the first switch transistor 111; and the source of the first switch transistor 111 is connected to the BL, such that the first antifuse memory MOS transistor 101 is electrically connected to the BL after the first switch transistor 111 is turned on. The second antifuse memory MOS transistor 102 is provided with a source that is idle, and a drain connected to the drain of the second switch transistor 112; and the source of the second switch transistor 112 is connected to the BL, such that the second antifuse memory MOS transistor 102 is electrically connected to the BL after the second switch transistor 112 is turned on.

Since the first switch transistor 111 and the second switch transistor 112 have a same source connection relationship, by sharing the source, namely by sharing the same doped region with the first switch transistor 111 and the second switch transistor 112, the layout area of the antifuse integrated structures 100 is reduced.

For the antifuse memory cells, the programming wires PGM control the conduction of the antifuse MOS transistors to form memory cells, and the WLs control the switch transistors to facilitate the write of stored data into the BLs. After the corresponding WL is gated, the antifuse memory cells are electrically connected to the BLs. Through a discharge speed of the antifuse memory cells to BL charges (by comparing a BL voltage with a standard voltage after a preset time), it can be determined whether the antifuse memory cells are broken down, so as to obtain 1-bit binary data stored in the antifuse memory cells.

In one example, referring to FIG. 6, the gate of the first antifuse memory MOS transistor 101 is arranged on a top surface of a part of the active region 200 between the first doped region 212 and the second doped region 222, the gate of the first switch transistor 111 is arranged on a top surface of a part of the active region 200 between the second doped region 222 and the third doped region 232, the gate of the second switch transistor 112 is arranged on a top surface of a part of the active region 200 between the third doped region 232 and the fourth doped region 242, and the gate of the second antifuse memory MOS transistor 102 is arranged on a top surface of a part of the active region 200 between the fourth doped region 242 and the fifth doped region 252. That is, the parts of the active region of the first antifuse memory MOS transistor 101, the first switch transistor 111, the second switch transistor 112 and the second antifuse memory MOS transistor 102 are set by means of top gates.

In one example, referring to FIG. 7, the gate of the first antifuse memory MOS transistor 101 is embedded in a part of the active region 200 between the first doped region 212 and the second doped region 222, the gate of the first switch transistor 111 is embedded in a part of the active region 200 between the second doped region 222 and the third doped region 232, the gate of the second switch transistor 112 is embedded in a part of the active region 200 between the third doped region 232 and the fourth doped region 242, and the gate of the second antifuse memory MOS transistor 102 is embedded in a part of the active region 200 between the fourth doped region 242 and the fifth doped region 252. That is, the parts of the active region of the first antifuse memory MOS transistor 101, the first switch transistor 111, the second switch transistor 112 and the second antifuse memory MOS transistor 102 are set by embedding gates.

In combination with FIG. 6 and FIG. 7, each antifuse integrated structure further includes an insulating layer 203 covering the active region 200, where a BL (205) is arranged on the insulating layer 203 and electrically connected to the third doped region 232.

In some embodiments, the insulating layer 203 is provided with a conductive through hole (not shown in the drawing) and a conductive layer 204. The conductive through hole (not shown in the drawing) exposes the top surface of the third doped region 232. The conductive layer 204 is filled in the conductive through hole (not shown in the drawing), and is provided with one end in contact with the third doped region 232 and the other end in contact with the BL (205), such that the BL is electrically connected to the third doped region 232.

For the layout diagram of the antifuse matrix, referring to FIG. 1, FIG. 8, and FIG. 10, the antifuse matrix includes a plurality of rows of antifuse integrated structures 100 arranged in the WL extension direction, and a plurality of columns of antifuse integrated structures 100 arranged in the BL extension direction. The plurality of antifuse integrated structures 100 in each row of antifuse integrated structures 100 are arranged at intervals in the WL extension direction, and the plurality of antifuse integrated structures 100 in each column of antifuse integrated structures 100 are arranged at intervals in the BL extension direction. Two adjacent antifuse integrated structures 100 are staggered in two adjacent columns in the BL extension direction.

Referring to FIG. 9, FIG. 9 corresponds to the arrangement of BLs in FIG. 8, the conductive through holes of the same row of antifuse integrated structures 100 (referring to FIG. 1) are located on the same straight line, and the BL (205) is arranged linearly and can cover the conductive through holes located on the same straight line to simplify a forming process of the BL (205).

Referring to FIG. 11, FIG. 11 corresponds to the arrangement of BLs in FIG. 10, the conductive through hole is arranged on one side of the connected BL (205), the conductive through holes of two adjacent antifuse integrated structures 100 are arranged on both sides of the connected BL (205) in the BL (205) extension direction, and the BL is in contact with the conductive layer 204 (referring to FIG. 6 and FIG. 7) through the bit line extension layer 300. The BL and the conductive layer are connected through the bit line extension layer 300, so as to ensure the stability of electrical contact between the bit line and the conductive layer, and prevent the formed antifuse matrix from having a conductive defect.

In one example, referring to FIG. 1 and FIG. 2, the antifuse integrated structures 100 connected through the same WL are arranged at equal intervals. That is, every two adjacent antifuse integrated structures 100 have a same interval in the WL extension direction, so as to avoid the destroy of the overall electrical isolation effect of the antifuse memory array due to a smaller interval between every two adjacent antifuse integrated structures 100.

In one example, referring to FIG. 1 and FIG. 2, the antifuse integrated structures 100 connected through the same BL are arranged at equal intervals. That is, every two adjacent antifuse integrated structures 100 have a same interval in the BL extension direction, so as to avoid the destroy of the overall electrical isolation effect of the antifuse memory array due to a smaller interval between every two adjacent antifuse integrated structures 100.

In one example, referring to FIG. 1 and FIG. 2, the BL connected to a first column of antifuse integrated structures 100 is a first dummy bit line Dummy1, and the BL connected to a last column of antifuse integrated structures 100 is a second dummy bit line Dummy2. By setting dummy BLs at the edge of the antifuse matrix, it is ensured that the antifuse integrated structures 100 located at the edge of the antifuse matrix are consistent with the antifuse integrated structures inside the matrix in layout environment, so as to prevent the antifuse memory cells at the edge from having defects and being incapable of working normally.

In one example, referring to FIG. 1 and FIG. 2, gates of the first antifuse memory MOS transistors 101 of a first row of antifuse integrated structures 100 are connected to a first dummy programming wire Dummy3, and gates of the second antifuse memory MOS transistors 102 of a last row of antifuse integrated structures 100 are connected to a second dummy programming wire Dummy4. By setting dummy programming wires at the edge of the antifuse matrix, it is ensured that the antifuse integrated structures 100 located at the edge of the antifuse matrix are consistent with the antifuse integrated structures inside the matrix in layout environment, so as to prevent the antifuse memory cells at the edge from having defects and being incapable of working normally.

In some embodiments, referring to FIG. 1 and FIG. 2, gates of the first switch transistors 111 of the first row of antifuse integrated structures 100 are connected to a first dummy word line Dummy5, and gates of the second switch transistors 112 of the last row of antifuse integrated structures 100 are connected to a second dummy word line Dummy6. The first dummy programming wire Dummy3 and the second dummy programming wire Dummy4 are located on the outermost side of the antifuse matrix; and the first dummy word line Dummy5 and the second dummy word line Dummy6 are located on the secondary outer side of the antifuse matrix. By setting dummy WLs at the edge of the antifuse matrix, it is ensured that the antifuse integrated structures 100 located at the edge of the antifuse matrix are consistent with the antifuse integrated structures inside the matrix in layout environment, so as to prevent the antifuse memory cells at the edge from having defects and being incapable of working normally.

According to the embodiment of the present disclosure, the layout length of the antifuse memory array decreases in the BL extension direction. Therefore, on the basis of the original layout area and the layout of a memory array with the same capacity, the interval between a switch unit and an antifuse memory cell located in the same active region increases to ensure the electrical isolation effect of electrical components in the memory array formed by the antifuse integrated structures.

It should be noted that, the specific connection manner of the "source" and "drain" above does not limit the embodiment of the present disclosure. In other embodiments, a connection manner in which the "source" is replaced with the "drain", and the "drain" is replaced with the "source" may be used. In addition, in order to highlight the innovative part of the present disclosure, units that are not closely related to resolving the technical problem proposed by the present disclosure are not introduced in this embodiment, but this does not indicate that there are no other units in this embodiment.

Another embodiment of the present disclosure also provides a memory, where a memory array of the memory applies the antifuse array structure provided by the above embodiment. The antifuse array structure provided by the above embodiment is used as the memory array. Therefore, on the basis of the original layout area and the layout of a memory array with the same capacity, the interval between a switch unit and an antifuse memory cell located in the same active region increases to ensure the electrical isolation effect of electrical components in the memory array formed by the antifuse integrated structures.

Figure 12:
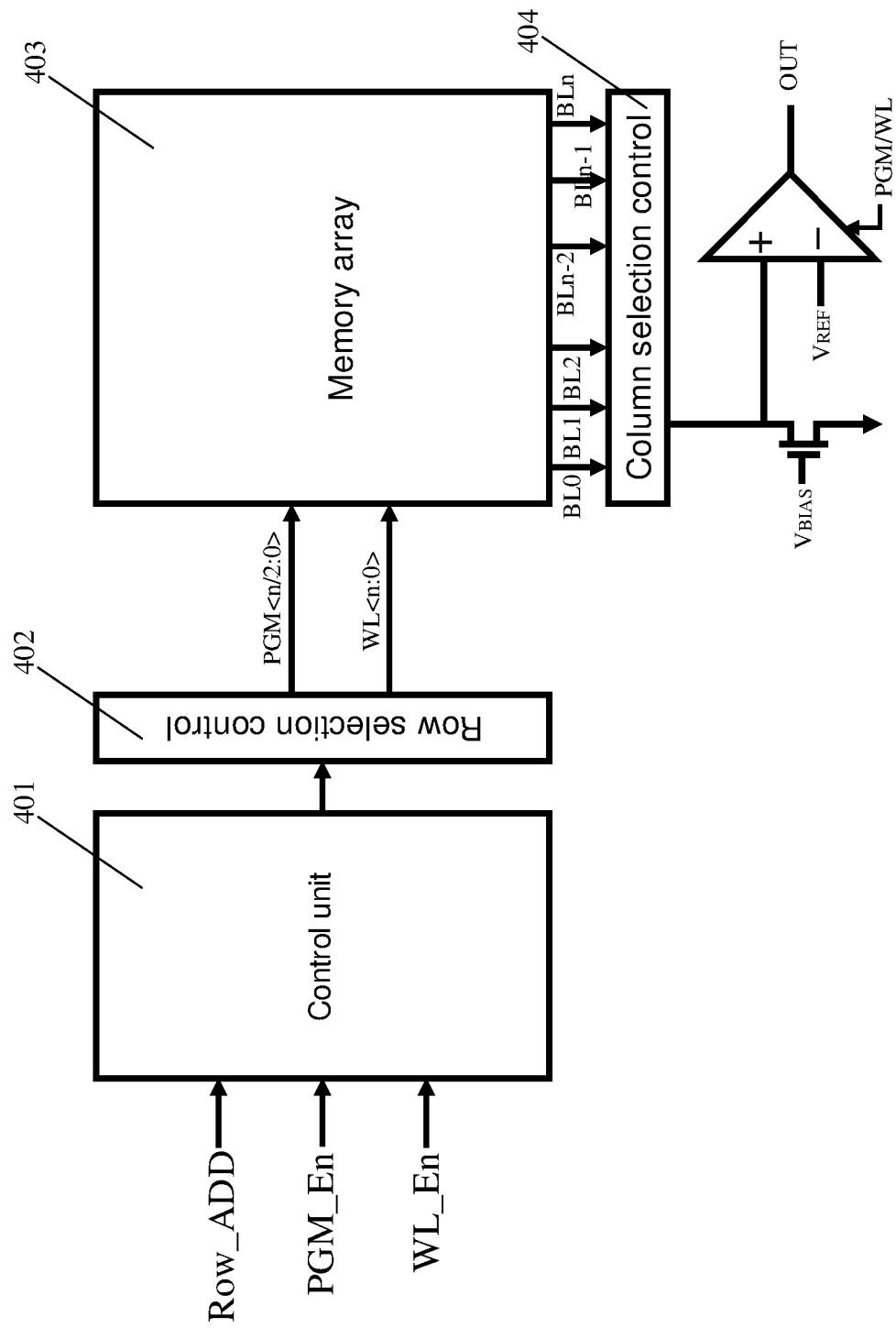
FIG. 12 is a schematic diagram of a dummy structure of a memory according to another embodiment of the present disclosure.
Figure 13:
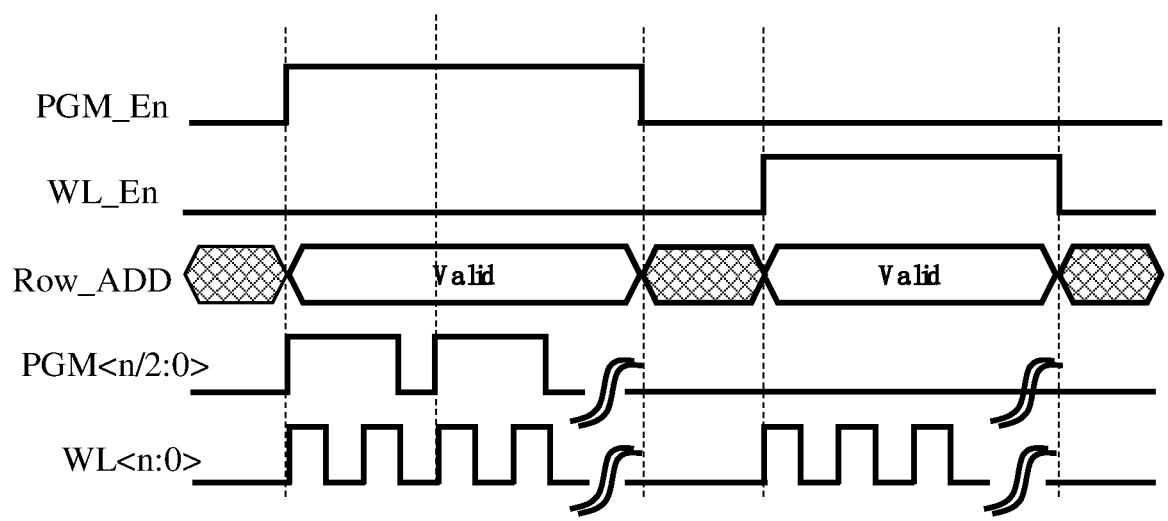
FIG. 13 is a schematic timing diagram of a programming stage and a readout stage of a memory according to another embodiment of the present disclosure.

FIG. 12 is a schematic diagram of a dummy structure of a memory according to this embodiment; and FIG. 13 is a schematic timing diagram of a programming stage and a readout stage of a memory according to this embodiment. The memory provided by this embodiment is further described below in detail with reference to the accompanying drawings, and the details are as follows:

Referring to FIG. 12, the memory includes: a memory array 403 employing the antifuse array structure according to any above embodiment; a control unit 401 configured to receive a row address signal Row_ADD, a programming enable signal PGM_En, and a WL enable signal WL_En; a row selection control unit 402 connected to the memory array 403 and the control unit 401, and configured to generate a programming strobe signal PGM<n/2:0> according to the row address signal Row_ADD and the programming enable signal PGM_En and generate a WL strobe signal Wl<n:0> according to the row address signal Row_ADD and the WL enable signal WL_En; and a column selection control unit 404 connected to the memory array 403, and configured to turn on a corresponding BL of the memory array 403 according to a BL strobe signal (not shown in the drawing).

The programming enable signal PGM_En is configured to instruct the programming wire to be turned on; the WL enable signal WL_En is configured to instruct the WL to be turned on; the programming strobe signal PGM<n/2:0> is configured to turn on the programming wire PGM in the corresponding memory array 403; and the WL strobe signal Wl<n:0> is configured to turn on the WL in the corresponding memory array 403.

Referring to FIG. 13, the programming enable signal PGM_En and the row address signal Row_ADD are provided in the programming stage to generate the programming strobe signal PGM<n/2:0>, such that the corresponding antifuse MOS transistor is selected and fused to form antifuse memory cells, the WL strobe signal Wl<n:0> controls the switch transistors to be turned on, and the corresponding BL writes data into the antifuse memory cells. The WL enable signal WL_En and the row address signal Row_ADD are provided in the readout stage to generate the WL strobe signal Wl<n:0>, such that the corresponding antifuse memory cell is selected and electrically connected to the BL.

Through joint control of the BL and the WL, after the corresponding WL is gated, the antifuse memory cells are electrically connected to the BLs. Through a discharge speed of the antifuse memory cells to BL charges (by comparing a BL voltage with a standard voltage after a preset time), it can be determined whether the antifuse memory cells are broken down, so as to obtain 1-bit binary data stored in the antifuse memory cells.

It should be noted that since the programming wire PGM in this embodiment is connected to two antifuse memory cells controlled by different WLs. That is, a high level duration required by the programming strobe signal PGM<n/2:0> needs to cover the time when the WL strobe signal WL<n:0> is at a high level twice to complete the programming of data.

Each unit involved in this embodiment is a logical unit. During actual application, a logical unit may be a physical unit, or may be a part of a physical unit, or may be implemented as a combination of a plurality of physical units. In addition, in order to highlight the innovative part of the present disclosure, units that are not closely related to resolving the technical problem proposed by the present disclosure are not introduced in this embodiment, but this does not indicate that there are no other units in this embodiment.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the antifuse array structure and the memory provided by the embodiments of the present disclosure, the antifuse array structure includes a plurality of antifuse integrated structures. Each antifuse integrated structure includes a first antifuse memory MOS transistor, a second antifuse memory MOS transistor, a first switch transistor, and a second switch transistor, where the first antifuse memory MOS transistor and the second antifuse memory MOS transistor are controlled through adjacent programming wires. That is, the two antifuse memory cells are controlled through the adjacent programming wires. The first switch transistor and the second switch transistor are used as switch transistors of the antifuse memory cells, and are controlled through the adjacent WLs. In the antifuse array, the extension direction of the programming wires is the same as the WL extension direction. That is, the extension direction of the programming wires is perpendicular to the BL extension direction. In the BL extension direction, the programming wire is further configured to control two adjacent antifuse integrated structures arranged in the BL extension direction, and the two antifuse memory cells respectively belong to two adjacent antifuse integrated structures, thereby reducing the layout length of the antifuse memory array in the BL extension direction. On the basis of the original layout area and the layout of a memory array with the same capacity, the interval between a switch unit and an antifuse memory cell located in the same active region increases to ensure the electrical isolation effect of electrical components in the antifuse memory array.

The invention claimed is:
1. An antifuse array structure, comprising:
a plurality of antifuse integrated structures, arranged in a bit line extension direction and a word line extension direction to form an antifuse matrix, the bit line extension direction being perpendicular to the word line extension direction;
wherein the antifuse integrated structure is arranged in a same active region, and an extension direction of the active region is the same as the bit line extension direction; and
each of the antifuse integrated structures comprises:
a first antifuse memory metal oxide semiconductor (MOS) transistor, a first switch transistor, a second switch transistor, and a second antifuse memory MOS transistor sequentially arranged in the bit line extension direction, wherein
the first switch transistor and the second switch transistor are respectively controlled through two adjacent word lines, a common terminal of the first switch transistor and the second switch transistor is connected to a bit line, the first antifuse memory MOS transistor and the second antifuse memory MOS transistor are respectively controlled through two adjacent programming wires, and the programming wire is further configured to control adjacent antifuse integrated structures in the bit line extension direction.

2. The antifuse array structure according to claim 1, wherein the active region comprises an active region body, a length direction of the active region body is the extension direction of the active region, and a width of each part of the active region body is the same in the extension direction of the active region.

3. The antifuse array structure according to claim 2, wherein the active region further comprises a bump arranged on at least one side of the active region body, a length of the bump is smaller than a length of the active region body in the extension direction of the active region, and a width of a middle of the active region is larger than a width of both ends of the active region in the word line extension direction.

4. The antifuse array structure according to claim 3, wherein the bump is arranged on one side of the active region body, and the bumps of two adjacent active regions are oppositely arranged in the bit line extension direction.

5. The antifuse array structure according to claim 1, wherein in the bit line extension direction, a gate of the second antifuse memory MOS transistor of each of the antifuse integrated structures and a gate of the first antifuse memory MOS transistor of an adjacent antifuse integrated structure are connected to a same programming wire.

6. The antifuse array structure according to claim 1, wherein
a gate of the first antifuse memory MOS transistor is connected to a first programming wire;
the first switch transistor is provided with a gate connected to a first word line, a source connected to the first antifuse memory MOS transistor, and a drain connected to the bit line;
the second switch transistor is provided with a gate connected to a second word line, a source connected to the second antifuse memory MOS transistor, and a drain connected to the bit line; and
a gate of the second antifuse memory MOS transistor is connected to a second programming wire.

7. The antifuse array structure according to claim 1, wherein the active region comprises:
a first doped region, a second doped region, a third doped region, a fourth doped region, and a fifth doped region sequentially arranged in the extension direction of the active region; wherein
the first doped region is an idle terminal of the first antifuse memory MOS transistor, the second doped region is a common terminal of the first antifuse memory MOS transistor and the first switch transistor, the third doped region is the common terminal of the first switch transistor and the second switch transistor, the fourth doped region is a common terminal of the second switch transistor and the second antifuse memory MOS transistor, and the fifth doped region is an idle terminal of the second antifuse memory MOS transistor; and the bit line is electrically connected to the third doped region.

8. The antifuse array structure according to claim 7, further comprising:

an insulating layer, covering the active region, wherein the bit line is arranged on the insulating layer, the insulating layer is further internally provided with a conductive through hole, and the conductive through hole exposes a top surface of the third doped region; and a conductive layer, filled in the conductive through hole, and provided with one end in contact with the third doped region and the other end in contact with the bit line, such that the bit line is electrically connected to the third doped region.

9. The antifuse array structure according to claim 8, wherein the conductive through hole is arranged on one side of a connected bit line, the conductive through holes of two adjacent antifuse integrated structures are arranged on both sides of the connected bit line in the bit line extension direction, and the connected bit line is in contact with the conductive layer through a bit line extension layer.

10. The antifuse array structure according to claim 7, wherein a gate of the first antifuse memory MOS transistor is arranged on a top surface of a part of the active region between the first doped region and the second doped region, a gate of the first switch transistor is arranged on a top surface of a part of the active region between the second doped region and the third doped region, a gate of the second switch transistor is arranged on a top surface of a part of the active region between the third doped region and the fourth doped region, and a gate of the second antifuse memory MOS transistor is arranged on a top surface of a part of the active region between the fourth doped region and the fifth doped region.

11. The antifuse array structure according to claim 7, wherein a gate of the first antifuse memory MOS transistor is embedded in a part of the active region between the first doped region and the second doped region, a gate of the first switch transistor is embedded in a part of the active region between the second doped region and the third doped region, a gate of the second switch transistor is embedded in a part of the active region between the third doped region and the fourth doped region, and a gate of the second antifuse memory MOS transistor is embedded in a part of the active region between the fourth doped region and the fifth doped region.

12. The antifuse array structure according to claim 1, wherein the antifuse matrix comprises a plurality of columns of the antifuse integrated structures arranged in the word line extension direction, wherein a bit line connected to a first column of the antifuse integrated structures is a first dummy bit line, and a bit line connected to a last column of the antifuse integrated structures is a second dummy bit line.

13. The antifuse array structure according to claim 1, wherein the antifuse matrix comprises a plurality of rows of the antifuse integrated structures arranged in the bit line extension direction, wherein gates of the first antifuse memory MOS transistors of a first row of the antifuse integrated structures are connected to a first dummy programming wire, and gates of the second antifuse memory MOS transistors of a last row of the antifuse integrated structures are connected to a second dummy programming wire.

14. The antifuse array structure according to claim 13, wherein gates of the first switch transistors of the first row of the antifuse integrated structures are connected to a first dummy word line, and gates of the second switch transistors of the last row of the antifuse integrated structures are connected to a second dummy word line, wherein the first dummy programming wire and the second dummy programming wire are located on an outermost side of the antifuse matrix, and the first dummy word line and the second dummy word line are located on a secondary outer side of the antifuse matrix.

15. A memory, comprising a memory array employing the antifuse array structure according to claim 1.

* * * * *